(12) United States Patent
Inoue (10) Patent No.: US 8,149,019 B2
(45) Date of Patent: Apr. 3, 2012

(54) CHOPPER TYPE COMPARATOR AND A/D CONVERTER

(75) Inventor: Fumihiro Inoue, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 256 days.

(21) Appl. No.: 12/665,356

(22) PCT Filed: Jun. 6, 2008

(86) PCT No.: PCT/JP2008/060452
§ 371 (c)(1),
(2), (4) Date: Dec. 18, 2009

(87) PCT Pub. No.: WO2009/001657
PCT Pub. Date: Dec. 31, 2008

(65) Prior Publication Data
US 2010/0182052 A1 Jul. 22, 2010

(30) Foreign Application Priority Data
Jun. 22, 2007 (JP) .................................. 2007-165341

(51) Int. Cl.
*H03L 7/06* (2006.01)
(52) U.S. Cl. .......................................... 327/77; 327/63
(58) Field of Classification Search ................. 327/63, 327/64, 77, 82
See application file for complete search history.

(56) References Cited

U.S. PATENT DOCUMENTS

| 5,041,744 A | * | 8/1991 | Sakai et al. ................. 327/77 |
| 5,546,028 A | * | 8/1996 | Yamaguchi ................. 327/64 |
| 5,783,961 A | * | 7/1998 | Zhou et al. ................. 327/85 |
| 6,271,691 B1 | * | 8/2001 | Toyoda et al. ............... 327/77 |
| 6,624,667 B2 | * | 9/2003 | Nii ........................... 327/77 |
| 7,157,946 B2 | * | 1/2007 | Arai et al. ................... 327/77 |
| 7,439,780 B2 | * | 10/2008 | Sugai ......................... 327/124 |

FOREIGN PATENT DOCUMENTS

| JP | 05-235767 | 9/1993 |
| JP | 8-316801 | 11/1996 |
| JP | 11-8534 | 1/1999 |
| JP | 2004-56649 | 2/2004 |

* cited by examiner

*Primary Examiner* — Hai L Nguyen
(74) *Attorney, Agent, or Firm* — IPUSA, PLLC (57) ABSTRACT

A chopper type comparator including a first power supply line to which a first power source is supplied, a second power supply line to which a second power source having lower voltage than the first power source is supplied, a reference voltage input part to which a reference voltage is input, a target comparison voltage input part to which a target comparison voltage is input, a comparing part configured to compare the size between the reference voltage input from the reference voltage input part and the target comparison voltage input from the target comparison voltage input part, an output part configured to output a comparison result of the comparing part, and a resistance value setting part configured to set resistance values of the first power supply line and/or the second power supply line.

7 Claims, 10 Drawing Sheets

|   | DIGITAL OUTPUT DATA | (MSB) $Q_5$ | $Q_4$ | $Q_3$ | $Q_2$ | $Q_1$ | $Q_0$ |
|---|---|---|---|---|---|---|---|
| 1 | $D_5$ | L | H | H | H | H | H |
| 2 | $D_4$ | $D_5$ | L | H | H | H | H |
| 3 | $D_3$ | $D_5$ | $D_4$ | L | H | H | H |
| 4 | $D_2$ | $D_5$ | $D_4$ | $D_3$ | L | H | H |
| 5 | $D_1$ | $D_5$ | $D_4$ | $D_3$ | $D_2$ | L | H |
| 6 | $D_0$ | $D_5$ | $D_4$ | $D_3$ | $D_2$ | $D_1$ | L |
| 7 | X | $D_5$ | $D_4$ | $D_3$ | $D_2$ | $D_1$ | $D_0$ |

CHOPPER TYPE COMPARATOR AND A/D CONVERTER

TECHNICAL FIELD

The present invention relates to a chopper type comparator used in, for example, an A/D converter and an A/D converter including the chopper type comparator.

BACKGROUND ART

A/D converters, which convert analog values into digital values, are widely used in various fields such as measuring, controls, and communications. The demand for accurately converting analog voltage minutely deviating from a reference voltage is growing as the precision of circuits becomes higher (e.g., increase of bit rates of recent A/D converters). One main element that determines the precision of the A/D converter is the comparator which performs comparison between an input voltage and a reference voltage. The comparators used for A/D converters include, for example, a chopper type comparator having a relatively simple circuit configuration.

Although high precision of the chopper type comparator, which is a main element of the A/D converter, is being demanded, one factor reducing the precision of the comparison of the chopper type comparator is offset error caused by, for example, parasitic MOSFETs inside an inverter of the chopper type comparator. As a method for reducing the error, there is proposed a method of reducing offset error by providing a special offset correcting circuit in a chopper type comparator (see, for example, Patent Document 1).

Patent Document 1: Japanese Laid-Open Patent Publication No. 05-235767

DISCLOSURE OF THE INVENTION

Problem to be Solved by Invention

Although methods for improving the precision of comparison by a chopper type comparator of an A/D converter have been proposed in the past, sufficient precision of the comparison could not be attained.

Accordingly, it is a general object of the present invention to provide a chopper type comparator for reducing error caused by changes of voltage of a power supply corresponding to changes of power consumption and an A/D converter including the chopper type comparator.

Means for Solving Problem

In order to achieve such object, the first aspect of the present invention provides a chopper type comparator includes a first power supply line to which a first power source is supplied; a second power supply line to which a second power source having lower voltage than the first power source is supplied; a reference voltage input part to which a reference voltage is input; a target comparison voltage input part to which a target comparison voltage is input; a comparing part configured to compare the sizes between the reference voltage input from the reference voltage input part and the target comparison voltage input from the target comparison voltage input part; an output part configured to output a comparison result of the comparing part; and a resistance value setting part configured to set resistance values of the first power supply line and/or the second power supply line.

According to the second aspect of the present invention, in the chopper type comparator of the first aspect of the present invention, the comparing part includes an inverting type comparator amplifier having a threshold voltage of a predetermined value, wherein the resistance value of the resistance value setting part is set as a resistance value that reduces a change of the threshold voltage of the inverting type comparator amplifier.

According to the third aspect of the present invention, in the chopper type comparator of the second aspect of the present invention, the resistance value that reduces the change of the threshold voltage of the inverting type comparator amplifier is set based on a change of a value of a current flowing in the inverting type comparator amplifier.

According to the fourth aspect of the present invention, in the chopper type comparator of the first aspect of the present invention, the resistance value of the resistance value setting part includes a resistance value of a resistance created by wiring.

According to the fifth aspect of the present invention, in the chopper type comparator of the first invention, the resistance value of the resistance value setting part includes a resistance value of a resistance created by a bonding wire.

According to the sixth aspect of the present invention, in the chopper type comparator of the first aspect of the present invention, the resistance value of the resistance value setting part includes a resistance value of a resistance created by a through-hole.

According to the seventh aspect of the present invention an A/D converter includes the chopper type comparator of the first aspect of the present invention.

Effect of Invention

With the present invention, there can be provided a chopper type comparator and an A/D converter including the chopper type comparator that can reduce error of comparison and improve precision of comparison.

EXPLANATION OF REFERENCE NUMERALS 10 input selecting part
15 voltage maintaining part
20-1 inverting type comparator amplifier
20-2 inverting type comparator amplifier
20-3 inverting type comparator amplifier
21 positive side power supply part
22 negative side power supply part
23 MOS•FET
24 NMOS•FET
25 voltage maintaining part
30 resistance value setting part
35 voltage maintaining part
40 first power supply line
50 second power supply line
51 positive side power supply part
52 negative side power supply part
60 switch control part
61 positive side power supply part
62 negative side power supply part
100 chopper type comparator
110 comparing part
200 chopper type comparator
210 comparing part
300 chopper type comparator
310 comparing part
500 D/A converting part
600 register part
700 conversion controlling part
R1-R8 resistor
C1-C3 capacitor
SW1, SW2 switch
SW3-SW5 short-circuit selecting part
Vdd first power supply
Vss second power supply
Vref reference voltage input part
Vin0 target comparison voltage input part
Vin1-Vin3 input
Vout0-Vout3 output
Iinv, Iinv1-Iinv3 current
Vth threshold voltage
A analog voltage

BEST MODE FOR CARRYING OUT THE INVENTION

In the following, preferred embodiments of the present invention are described with reference to the accompanying drawings.

First Embodiment

Figure 1:
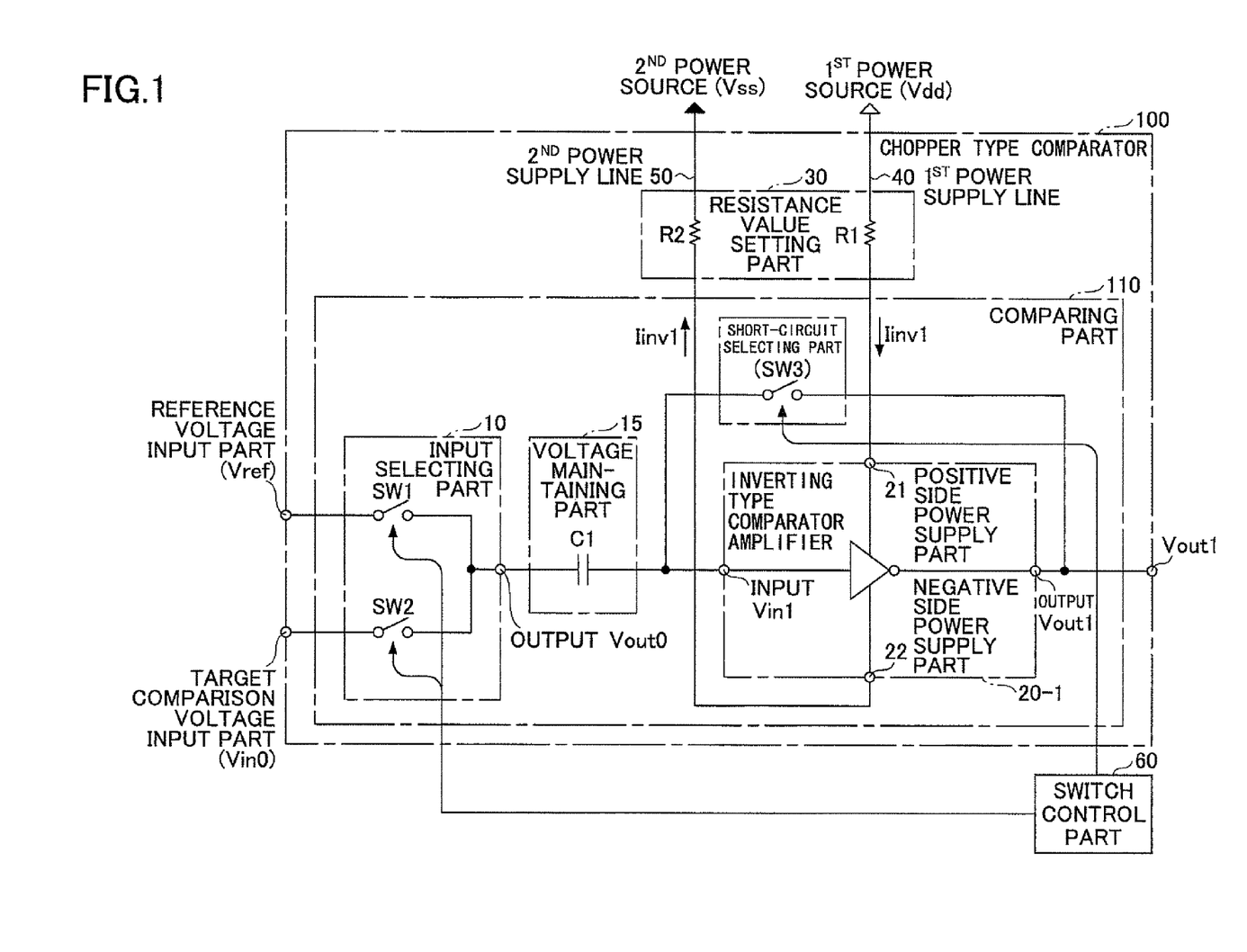
FIG. 1 is a schematic diagram illustrating an exemplary circuit configuration of a chopper type comparator 100 according to a first embodiment of the present invention.

FIG. 1 is a schematic diagram illustrating an exemplary circuit configuration of a chopper type comparator 100 according to a first embodiment of the present invention. The chopper type comparator 100 of FIG. 1 includes a resistance value setting part 30, a first power supply line 40, a second power supply line 50, and a comparing part 110.

A reference voltage input part (Vref) is a terminal to which a reference voltage is input. Further, a target comparison voltage input part (Vin0) is a terminal to which a target comparison voltage, which is to be compared with the reference voltage, is input. Vout1 is an output terminal that outputs a result of comparing between the reference voltage and the target comparison voltage.

The comparing part 110 includes an input selecting part 10, a voltage maintaining part 15, an inverting type comparator amplifier 20-1, and a short-circuit selecting part SW3. An output terminal (Vout0) of the input selecting part 10 is connected to one end of the voltage maintaining part 15. The other end of the voltage maintaining part 15 is connected to one end of the short-circuit selecting part SW3 and to an input terminal (Vin1) of the inverting type comparator amplifier 20-1.

The other end of the short-circuit selecting part SW3 is connected to an output terminal (Vout1) of the inverting type comparator amplifier 20-1. A first power source (Vdd) runs through a first power supply line 40 and connects with a positive side power supply part 21 of the inverting type comparator amplifier 20-1 via a resistor R1 in a resistance value setting part 30. A second power source (Vss) runs through a second power supply line 50 and connects with a negative side power supply part 22 of the inverting type comparator amplifier 20-1 via a resistor R2 in the resistance value setting part 30.

The input selecting part 10 of the comparing part 110 includes switches SW1 and SW2. The voltage maintaining part 15 of the comparing part 110 includes a capacitor C1. The voltage setting part 30 includes resistors R1 and R2. The resistance value setting part 30 is for setting the resistance value of the first power supply line 40 and the resistance value of the second power supply line 50. The switch control part 60 is for controlling the on/off switching of the switches SW1, SW2 of the input selecting part 10 and the short-circuit selecting part SW3 of the comparing part 110. Iinv1 indicates the electric current flowing in the inverting type comparator amplifier 20-1.

Next, an operation of the chopper type comparator 100 of FIG. 1 is described. First, a sampling operation is performed. That is, based on instructions from the switch control part 60, the switch SW1 is switched off (open), the switch SW2 is switched on (short-circuit), and the short-circuit selecting part SW3 is switched on (short-circuit). In this state, the voltages of the input terminal (Vin1) and the output terminal (Vout1) of the inverting type comparator amplifier 20-1 become equal because the input terminal (Vin1) and the output terminal (Vout1) of the inverting type comparator amplifier 20-1 are short-circuited via the short-circuit selecting part SW3.

Figure 2:
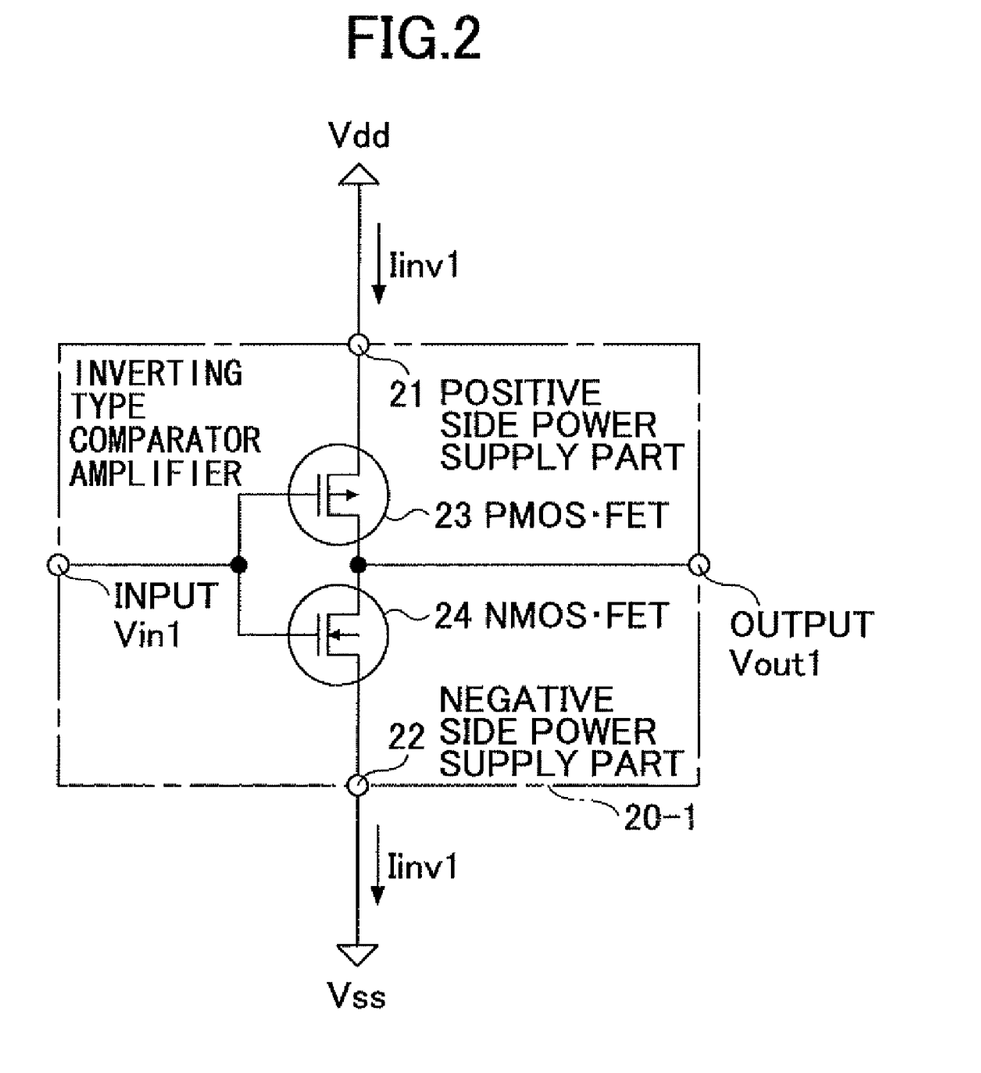
FIG. 2 is a schematic diagram illustrating an exemplary circuit configuration inside an inverting type comparator amplifier of a chopper type comparator 100 according to the first embodiment of the present invention.

Here, an operation of the inverting type comparator amplifier 20-1 is described in a case where the input terminal (Vin1) and the output terminal (Vout1) of the inverting type comparator amplifier 20-1 of the comparing part 110 are short-circuited. FIG. 2 is a schematic diagram illustrating an exemplary circuit configuration inside the inverting type comparator amplifier 20-1 of the chopper type comparator 100 of the first embodiment. Further, FIG. 3 is a schematic diagram illustrating examples of input/output characteristics of the inverting type comparator amplifier 20-1 of the chopper type comparator 100 according to the first embodiment.

As illustrated in FIG. 2, the inverting type comparator amplifier 20-1 includes a PMOS•FET23 and NMOS•FET24. The voltage of Vdd[V] is supplied to the positive side power supply part 21. The voltage of Vss[V] is supplied to the negative side power supply part 22. In a case of performing a switching operation with the inverting type comparator amplifier 20-1, either the PMOS•FET23 or the NMOS•FET24 is switched on and the output (Vout1) is 'H' or 'L'.

In a case where the input terminal (Vin1) and the output terminal (Vout1) of the inverting type comparator amplifier 20-1 are short-circuited, the PMOS•FET23 and the NMOS•FET24 of the inverting type comparator amplifier 20-1 are switched on simultaneously. Thus, in a case supposing that the ON resistances of the PMOS•FET23 and the NMOS•FET24 are substantially equal, the voltages of the input terminal (Vin1) and the output terminal (Vout1) of the inverting type comparator amplifier 20-1 become approximately (Vdd+Vss)/2 [V], thereby a threshold voltage of Vth [V] is attained.

Figure 3:
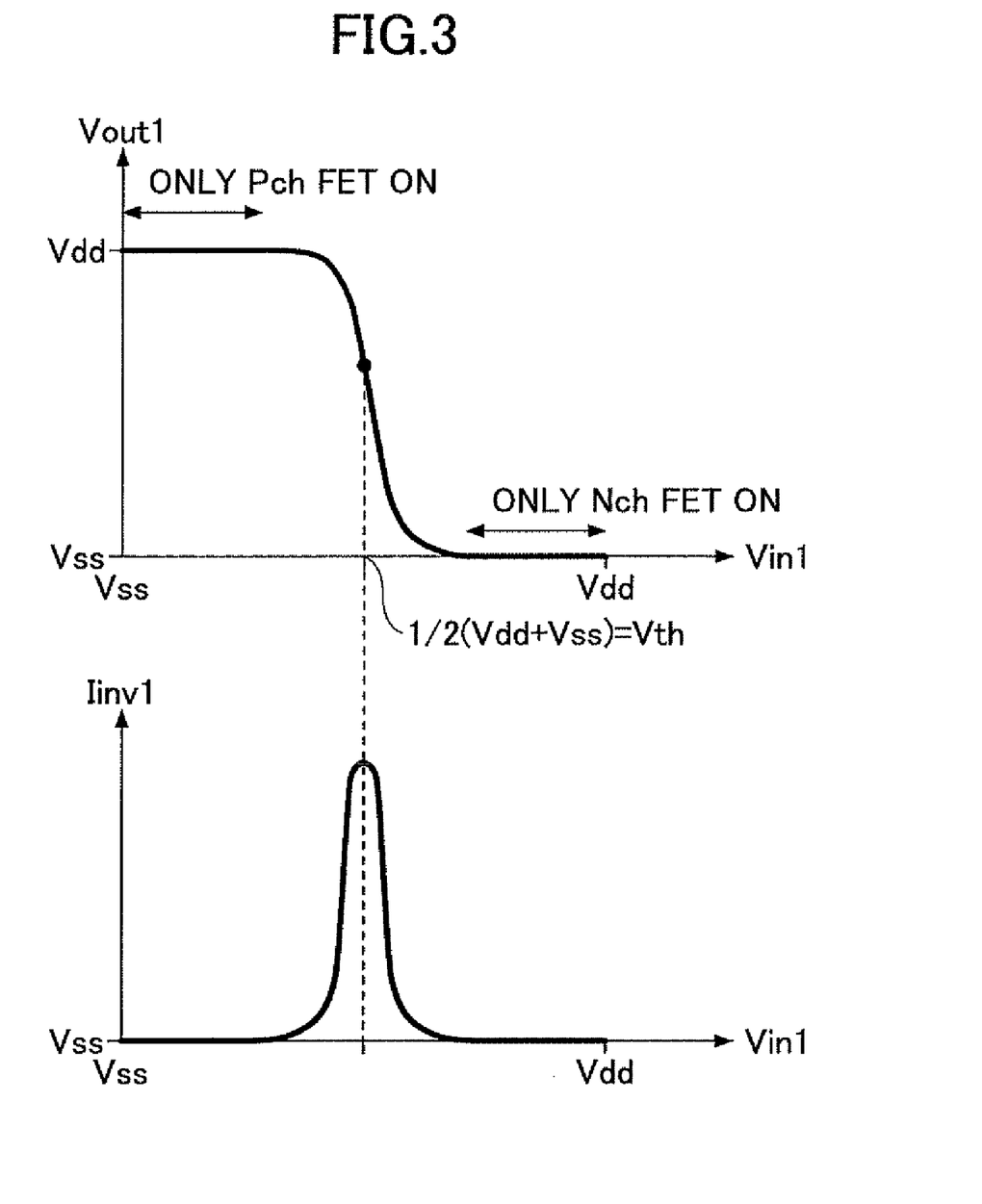
FIG. 3 is a schematic diagram illustrating examples of input/output characteristics of an inverting type comparator amplifier of a chopper type comparator 100 according to the first embodiment of the present invention.

In this state, the current Iinv1 flowing in the PMOS•FET23 and the NMOS•FET24 becomes maximum as illustrated in FIG. 3. It is to be noted that "ON resistance" refers to the reciprocal number (Vgs/Id) of the change of the drain current Id in a case where the voltage between the gate and source Vgs changes in the micro-region (same in the description hereinafter).

Accordingly, in a case where the input terminal (Vin1) and the output terminal (Vout1) of the inverting type comparator amplifier 20-1 in the comparing part 110 (illustrated in FIG. 1) are short-circuited via the short-circuit selecting part SW3, the voltages of the input terminal (Vin) and the output terminal (Vout) of the inverting type comparator amplifier 20-1 become a threshold voltage of Vth [V]. The voltage on one end of the voltage maintaining part 15 toward the inverting type comparator amplifier 20-1 also becomes the threshold voltage of Vth [V].

Here, when a target comparison voltage Vin0 [V] is input to the target comparison voltage input part (Vin0), the other end of the voltage maintaining part 15 also becomes Vin0 [V] because the switch SW2 in the input selecting part 10 is short-circuited during the sampling operation. Therefore, the voltages on both ends of the voltage maintaining part 15 become (Vth−Vin0) [V]. Thereby, a voltage of (Vth−Vin0) [V] is maintained at the voltage maintaining part 15.

Then, a comparing operation is performed. That is, based on instructions from the switch control part 60 illustrated in FIG. 1, the switch SW1 is switched on, the switch SW2 is switched off, and the short-circuit selecting part SW3 is switched off. When a reference voltage Vref [V] is input to the reference voltage input part (Vref), the voltages (Vth−Vin0 [V]) of both ends of the voltage maintaining part 15 do not change. Therefore, the voltage of the input terminal (Vin1) of the inverting type comparator amplifier 20-1 becomes Vin1=(Vref+(Vth−Vin0)) [V]. By changing this formula, the voltage of the input terminal (Vin1) becomes Vin1=((Vref−Vin0)+Vth) [V].

Here, in a case of Vin0>Vref, the output (Vout1) of the inverting type comparator amplifier 20-1 becomes 'H'. Further, in a case of Vin<Vref, the output (Vout1) of the inverting type comparator amplifier 20-1 becomes 'L'. In this manner, the Vin0 [V] is compared with Vref [V], inverted and amplified by the inverting type comparator amplifier, and the comparison result is output from the output terminal (Vout1) of the inverting type comparator amplifier 20-1.

The above description is the basic operation of the chopper type comparator 100 illustrated in FIG. 1.

Next, the difference of Iinv at the time of performing the above-described sampling operation and the time of performing the above-described comparing operation is described.

Figure 4:
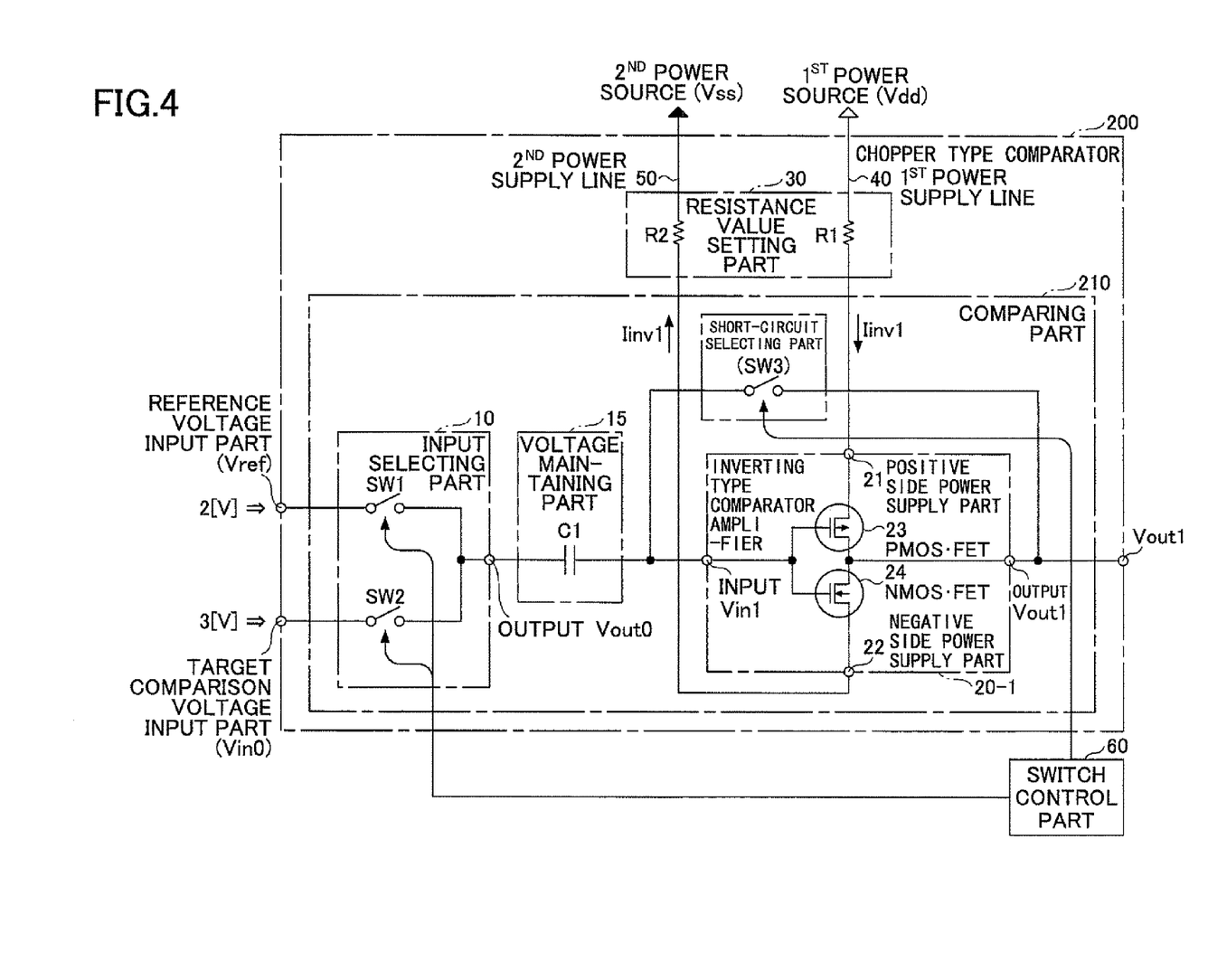
FIG. 4 is a schematic diagram illustrating an exemplary circuit configuration of a chopper type comparator 200 according to the first embodiment of the present invention.

FIG. 4 is a schematic diagram illustrating an exemplary circuit configuration of a chopper type comparator 200 according to the first embodiment of the present invention. In FIG. 4, like components are denoted with like reference numerals as of FIGS. 1 and 2 and are not further described. The differences with respect to FIG. 1 are that the inside configuration of the inverting type comparator amplifier 20-1 is illustrated and that conditions of Vref=2 [V] and Vin0=3 [V] are set.

It is to be noted that these conditions are merely set for the sake of explanation. This embodiment is not to be limited to these conditions. Further, the Iinv1 at the time of sampling is indicated as "Iinv1 (S)" and the Iinv1 at the time of comparison is indicated as "Iinv1 (C)". In FIG. 4, the threshold voltage Vth of the inverting type comparator amplifier 20-1 is determined according to the ON resistance of the PMOS•FET23 and the ON resistance of the NMOS•FET24. Here, in a case where the ON resistance of the PMOS•FET23 is expressed as P [Ohms] and the ON resistance of the NMOS•FET24 is expressed as N [Ohms], the threshold voltage can be expressed as Vth=((Vdd−Vss)×N)/(P+N)+Vss.

Figure 5:
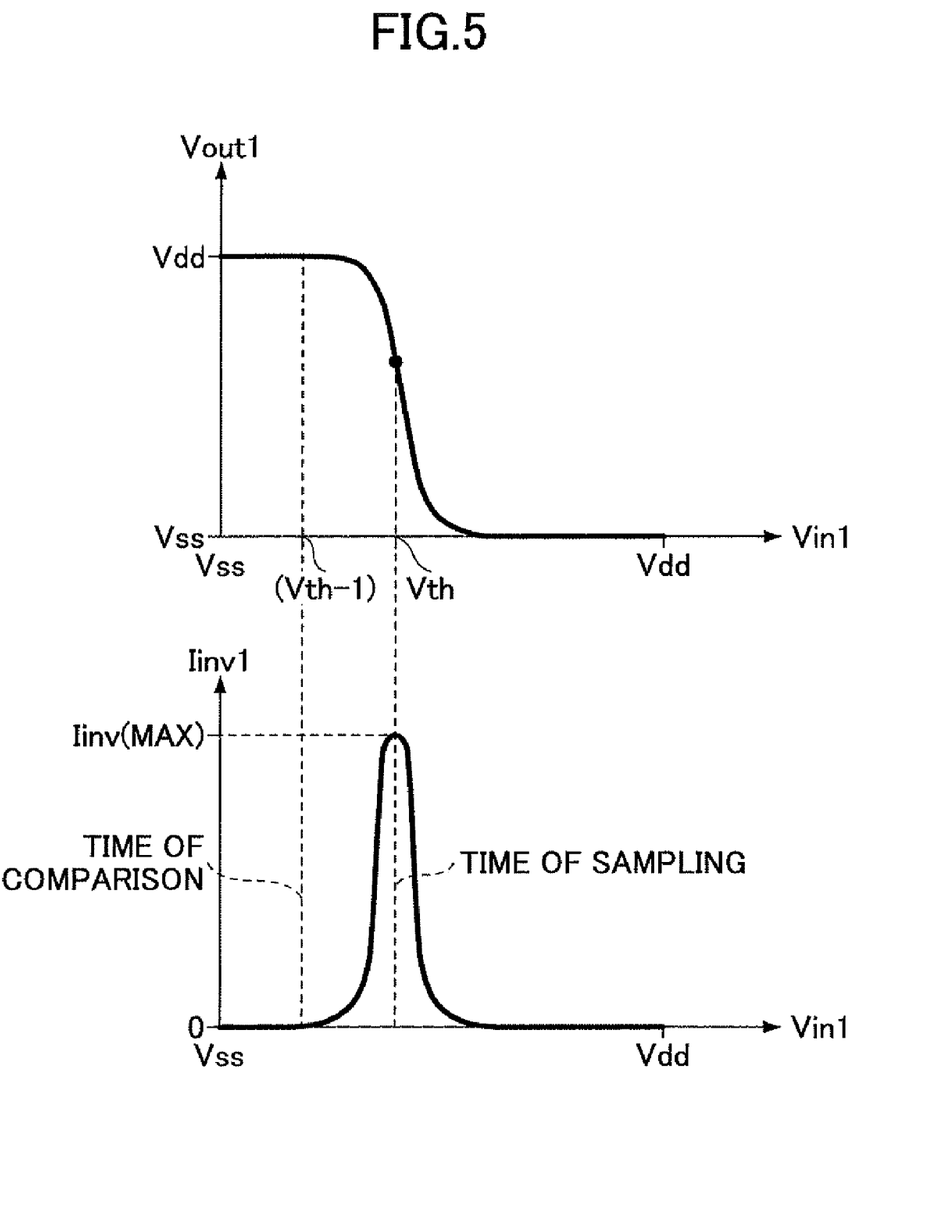
FIG. 5 is a schematic diagram illustrating examples of input/output characteristics of an inverting type comparator amplifier of a chopper type comparator 200 according to the first embodiment of the present invention.

Under the above-described conditions, the voltage of the input terminal (Vin1) and the voltage of the output terminal (Vout1) of the inverting type comparator amplifier 20-1 of FIG. 4 become a threshold voltage Vth during a sampling operation. A current Iinv1 (S) flows during this operation. FIG. 5 is a schematic diagram illustrating examples of input/output characteristics of an inverting type comparator amplifier 20-1 of a chopper type comparator 200 of FIG. 4. As illustrated in FIG. 5, the current during the sampling operation becomes a maximum current, so that Iinv1 (S)=Iinv1 (MAX).

During a comparing operation, the voltage of the input terminal (Vin1) of the inverting type comparator amplifier 20-1 of FIG. 4 becomes Vin1=((Vref−Vin0)+Vth)=(2−3)+Vth=(Vth−1) [V]. Because Vin1<Vth, the output terminal (Vout1) of the inverting type comparator amplifier becomes 'H'.

As illustrated in FIG. 5, in a case supposing that the position of Vin1=(Vth−1) [V] is sufficiently separated from the position of the Vin1=(Vth), the current flowing during the comparing operation is Iinv1 (C)=0. Accordingly, the current Iinv (S) flowing during the sampling operation is significantly different from the current Iinv (C) flowing during the comparing operation.

Next, the influence of the resistance value setting part 30 is described. A case where the resistors R1, R2 of the resistance value setting part 30 are not set with a particular resistance value is described. In this case, although it is ideal that the resistors R1, R2 have a resistance of 0, each of the resistors R1, R2, in reality, inherently has a resistance due to resistance generated by wires and the like.

For example, it is supposed that the resistor R1=r1 [Ohms] and the resistor R2=r2 [Ohms]. In a case where the change of the voltage of the positive side power supply part 21 is expressed as "ΔVdd(C)" and the change of the voltage of the negative side power supply part 22 is expressed as "ΔVss(C)", there should be a voltage drop of ΔVdd(C)=Iinv1(C)×r1, ΔVss(C)=Iinv(C)×r2. However, under the conditions of FIG. 4, no voltage drop due to the resistors R1, R2 occurs because Iinv1(C)=0; thereby, ΔVdd (C)=ΔVss(C)=0.

In other words, regardless of the values of the resistors R1, R2, the positive power supply part 21 of the inverting type comparator amplifier 20-1 of FIG. 4 becomes Vdd [V] and the negative power supply part 22 of the inverting type comparator amplifier 20-1 of FIG. 4 becomes Vss [V]. In a case where the threshold voltage during the comparing operation is Vth(C) and α=N/(P+N), the following Formula (1) can be obtained.

$$Vth(C)=((Vdd-Vss)\times N)/(P+N)+Vss=(Vdd-Vss)\times \alpha + Vss [V] \quad \text{[Formula (1)]}$$

On the other hand, because Iinv1(S)=Iinv1(MAX) during the sampling operation, the resistors R1, R2 cause a voltage drop of ΔVdd(S) Iinv1(MAX)×r1, ΔVss(S)=Iinv(MAX)×r2 in a case where the voltage change of the positive side power supply part 21 of the inverting type comparator amplifier 20-1 is expressed as ΔVdd(S) and the voltage change of the negative side power supply part 22 of the inverting type comparator amplifier 20-1 is expressed as ΔVss (S). Thereby, the voltage of the positive side power supply part 21 of the inverting type comparator amplifier 20-1 becomes (Vdd−ΔVdd(S)) [V], and the voltage of the negative side power supply part 22 of the inverting type comparator amplifier becomes (Vss+ΔVss(S)) [V].

Here, in a case where the threshold voltage during the sampling operation is Vth(S), the following Formula (2) can be obtained.

$$Vth(S)=((Vdd-\Delta Vdd(S))-(Vss+\Delta Vss(S))\times N/(P+N)+Vss+\Delta Vss(S)=((Vdd-\Delta Vdd(S))-(Vss+\Delta Vss(S)))\times \alpha+Vss+\Delta Vss(S)=(Vdd-\Delta Vdd(S))\times \alpha+(Vss+\Delta Vss(S))\times(1-\alpha)[V] \quad \text{[Formula (2)]}$$

By comparing Formula (1) and Formula (2), a relationship of Vth (C)≠Vth (S) is derived due to the influence of ΔVdd (S) and ΔVss (S). Thus, it can be understood that the threshold voltage during the comparing operation and the threshold voltage during the sampling operation do not become equal. As a result, an error occurs in the comparing operation by the inverting type comparator amplifier 20-1. This may be a problem for performing a precise comparing operation.

In a case where the difference between the threshold voltage Vth(S) during the sampling operation and the threshold voltage Vth(C) is ΔVth, the following Formula (3) can be obtained based on Formulas (1) and (2).

$$\Delta Vth=Vth(S)-Vth(C)=((Vdd-\Delta Vdd(S)\times \alpha+(Vss+\Delta Vss(S))\times(1-\alpha))-((Vdd-Vss)\times \alpha+Vss)=(-\alpha \times \Delta Vdd(S))+(1-\alpha)\times \Delta Vss(S) \quad \text{[Formula (3)]}$$

Further, in a case where a threshold change caused by ΔVdd(S) is ΔVth(Vdd) and a threshold change caused by ΔVss(S) is ΔVth(Vss), the following Formulas (4) and (5) can be obtained based on Formula (3).

$$\Delta Vth(Vdd)=(-\alpha \times \Delta Vdd(S)) \quad \text{[Formula (4)]}$$

$$\Delta Vth(Vss)=(1-\alpha)\times \Delta Vss(S) \quad \text{[Formula (5)]}$$

Further, the following Formulas (6) and (7) can be obtained.

$$\Delta Vth(Vdd)/\Delta Vdd(S)=-\alpha \quad \text{[Formula (6)]}$$

$$\Delta Vth(Vss)/\Delta Vss(S)=(1-\alpha) \quad \text{[Formula (7)]}$$

Further, the following Formula (8) can also be obtained.

$$\Delta Vth=\Delta Vth(Vdd)+\Delta Vth(Vss) \quad \text{[Formula (8)]}$$

Figure 6:
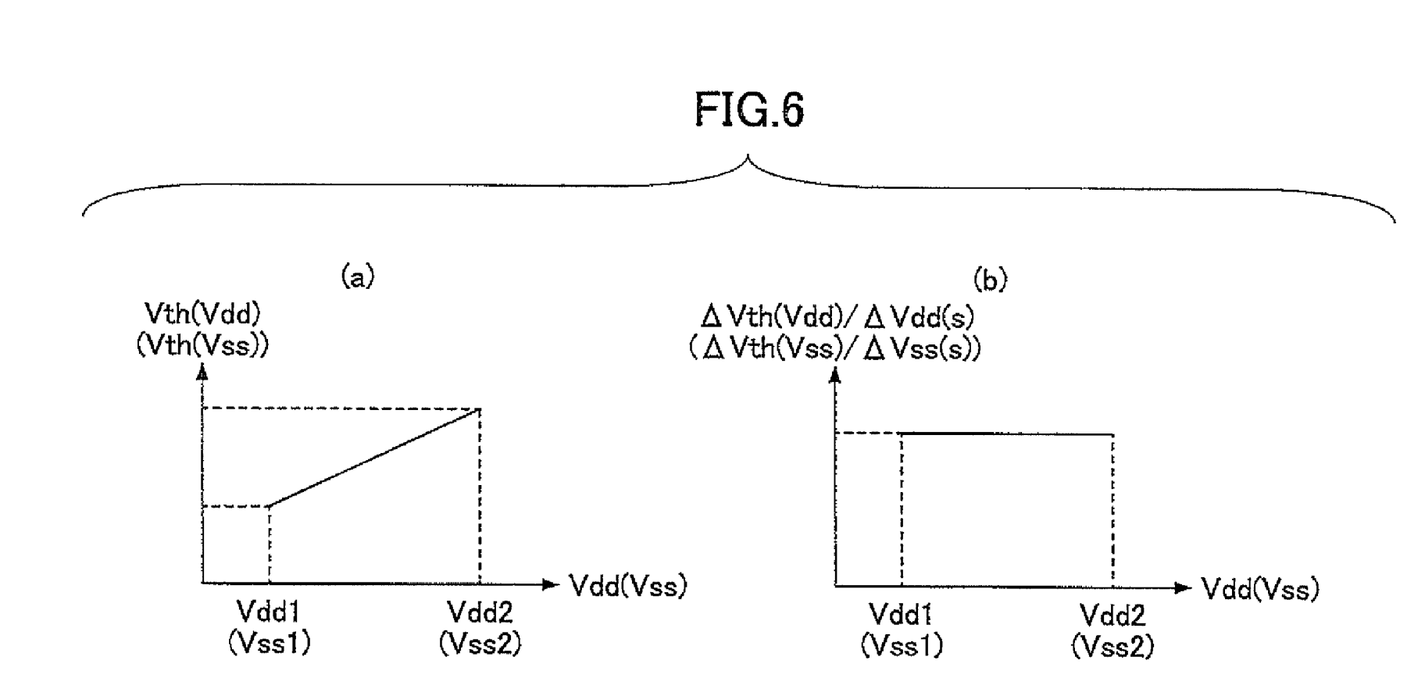
FIG. 6 is a schematic diagram illustrating that power supply voltages Vdd and Vss have a proportional relationship with respect to a threshold voltage Vth.

Because α is a unique value that is determined according to the ON resistance of the PMOS•FET23 and the ON resistance of the NMOS•FET24, Vth (Vdd)/ΔVdd(S) and Vth (Vss)/ΔVss(S) become a constant value. This is illustrated in (a) and (b) of FIG. 6. FIG. 6 is a schematic diagram illustrating that power supply voltages Vdd and Vss have a proportional relationship with respect to a threshold voltage Vth.

Here, the relationship between ΔVdd(S) and Iinv1(S) can be described as Formula (9):

$$\Delta Vdd(S)=(Iinv1(S)\times r1).$$

Further, the relationship between ΔVss(S) and Iinv1(S) can be described as Formula (10):

$$\Delta Vss=(Iinv1(S)\times r2).$$

The following Formula (11) can be obtained based on Formula (4):

$$\Delta Vth(Vdd)=(-\alpha \times \Delta Vdd(S))=-\alpha \times (Iinv1(S)\times r1).$$

The following Formula (12) can be obtained based on Formula (5):

$$\Delta Vth(Vss)=(1-\alpha)\times \Delta Vdd(S)=(1-\alpha)\times Iinv1(S)\times r2.$$

Figure 7:
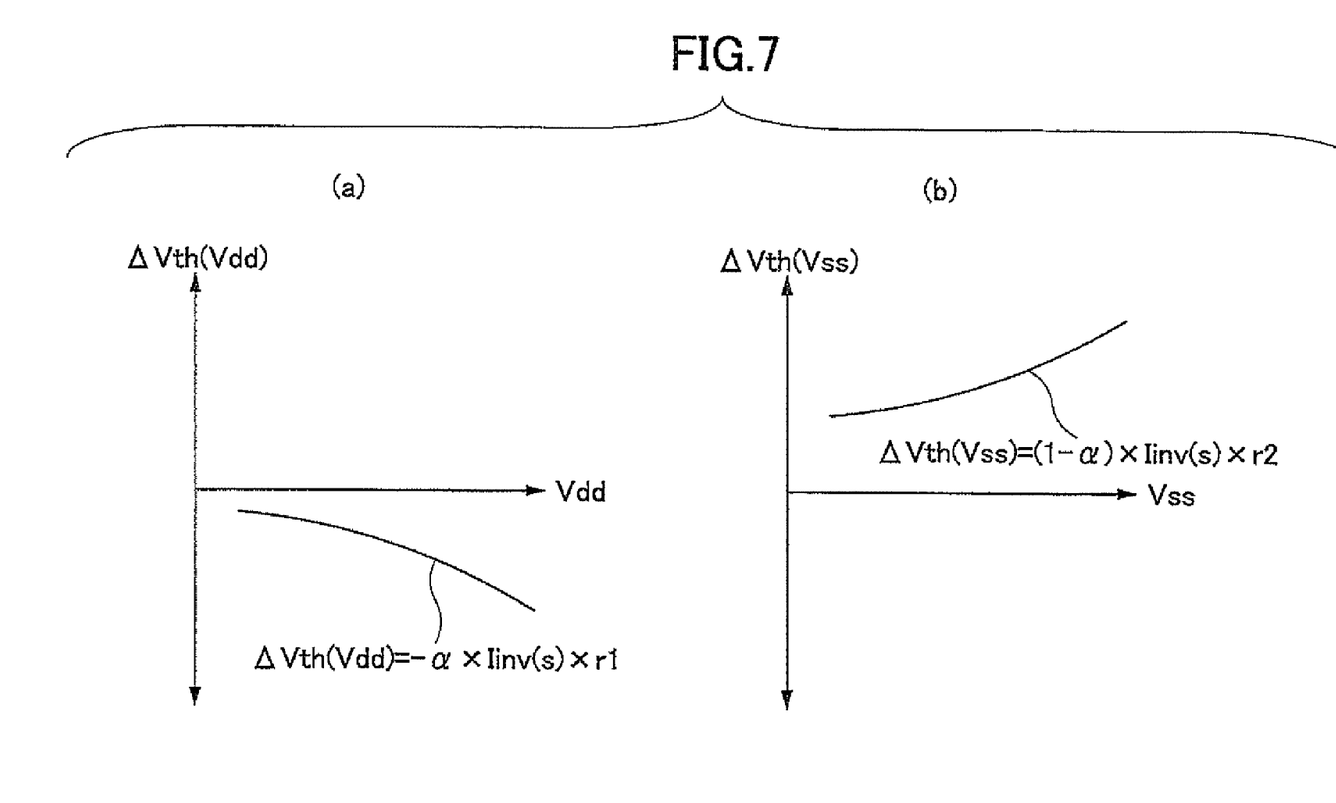
FIG. 7 is a schematic diagram illustrating a change ΔVth (Vdd) in the relationship between a power supply voltage and a threshold voltage and a change ΔVth (Vss) in the relationship between a power supply voltage and a threshold voltage.

As described above, α is a constant value; r1 and r2 are also constant values. As it is well known that the relationship between the voltage of FETs and the current of FETs can be expressed with a quadratic curve, Formulas (11) and (12) exhibit characteristics as illustrated in (a) and (b) of FIG. 7. FIG. 7 is a schematic diagram illustrating a change ΔVth (Vdd) in the relationship between a power supply voltage Vdd and a threshold voltage and a change ΔVth (Vss) in the relationship between a power supply voltage Vss and a threshold voltage.

As illustrated in (a) and (b) of FIG. 7, in a case where no particular values are set for the resistance values r1, r2 of the resistors R1, R2 of the resistance value setting part 30, ΔVth (Vdd)−ΔVth(Vss) does not always equal 0.

In a case where the difference between ΔVth(Vdd) and ΔVth(Vss) is expressed as ΔVth, the following Formula (13) is obtained.

$$\Delta Vth=\Delta Vth(Vdd)-\Delta Vth(Vss)=(-\alpha \times Iinv1(S)\times r1)+((1-\alpha)\times Iinv1(S)\times r2) \quad \text{[Formula (13)]}$$

By further rearrangement, the following Formula (14) can be obtained by obtaining a condition in which Formula (13)=0.

$$r1/r2=(1-\alpha)/\alpha \quad \text{[Formula (14)]}$$

That is, by setting r1 and/or r2 beforehand to satisfy Formula (14), change of threshold value caused by change of power supply voltage corresponding to power consumption change (Iinv11(S)−Iinv1(C)) can be reduced. As a result, error of comparison can be reduced, and the precision of comparison can be improved. It is to be noted that α, Iinv1(S), and Iinv1(C) are unique values of the circuit which are determined according to the characteristics of, for example, PMOS•FET23, NMOS•FET24 of the inverting type comparison amplifier 20-1. Thus, the values of α, Iinv1(S), and Iinv1 (C) can be derived beforehand.

Further, in the first embodiment, although the current flowing during the comparing operation equals to 0 (Iinv1(C)=0), in a case of Iinv1(C)≠0, Formula (13) becomes the following Formula (15).

$$\Delta Vth=\Delta Vth(Vdd)-\Delta Vth(Vss)=(-\alpha \times (Iinv1(S)-Iinv1(C)\times r1)+((1-\alpha)\times (Iinv(S)-Iinv(C)\times r2)=0 \quad \text{[Formula (15)]}$$

In the same manner as Formula (13), r1/r2 becomes equal to (1−α)/α by further rearrangement and obtaining a condition in which Formula (15)=0. That is, by setting r1 and/or r2 beforehand to satisfy Formula (14), a change of threshold value caused by change of power supply voltage corresponding to power consumption change (Iinv11(S)−Iinv1(C)) can be reduced. As a result, error of comparison can be reduced, and the precision of comparison can be improved.

In a case of a chopper type comparator used in a semiconductor integrated circuit, the resistance values r1, r2 of the resistors R1, R2 of the resistance value setting part 30 can be set to a predetermined value by forming the resistance by using, for example, polysilicon. Further, the resistance value r1 may be set to a predetermined value including a resistance value of the resistance created by the wiring of the first power supply line 40. The resistance value r2 may be set to a predetermined value including a resistance value of the resistance created by the wiring of the second power supply line 50. It is to be noted that the resistance created by the wiring can be adjusted by the width, the length, and the thickness of the wiring.

In a case where the first power supply line 40 includes bonding wire, the resistance value r1 may be set to a predetermined value including a resistance value of the resistance created by the bonding wire, and the resistance value r2 may be set to a predetermined value including a resistance value of the resistance created by the bonding wire.

Further, in a case where the first power supply line 40 passes through a through-hole that connects plural wiring layers, the resistance value r1 may be set to a predetermined value including a resistance value of the resistance created by the through-hole. Further, in a case where the second power supply line 50 passes through a through-hole that connects plural wiring layers, the resistance value r2 may be set to a predetermined value including a resistance value of the resistance created by the through-hole.

In a case of a chopper type comparator used on a printed circuit board, the resistance values r1, r2 may be set by using, for example, chip resistance. Further, the resistance value r1 may be set to a predetermined value of the resistance created by the wiring of the first power supply line 40. Further, the resistance value r2 may be set to a predetermined value of the resistance created by the wiring of the second power supply line 50. It is to be noted that the resistance created by the wiring can be adjusted by the width, the length, and the thickness of the wiring.

Further, in a case where the first power supply line 40 passes through a through-hole that connects plural wiring layers, the resistance value r1 may be set to a predetermined value including a resistance value of the resistance created by the through-hole. Further, in a case where the second power supply line 50 passes through a through-hole that connects plural wiring layers, the resistance value r2 may be set to a predetermined value including a resistance value of the resistance created by the through-hole.

Second Embodiment

Figure 8:
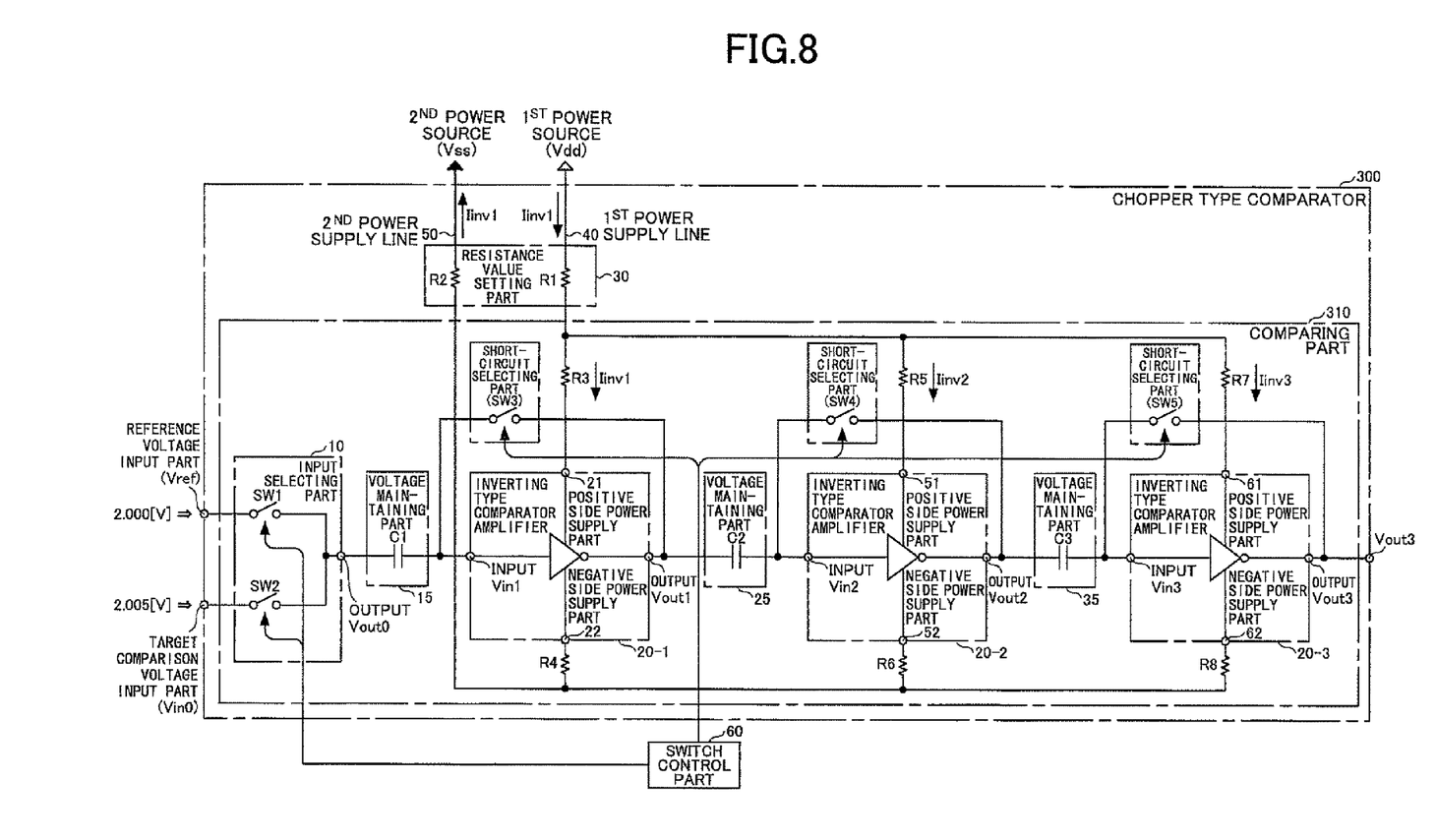
FIG. 8 is a schematic diagram illustrating an exemplary circuit configuration of a chopper type comparator 300 according to a second embodiment of the present invention.

FIG. 8 is a schematic diagram illustrating an exemplary circuit configuration of a chopper type comparator 300 according to a second embodiment of the present invention. In FIG. 2, like components are denoted with like reference numerals as in FIG. 1 and are not further described. The difference with respect to FIG. 1 is the configuration of a comparing part 310. The comparing part 310 has voltage maintaining parts 25, 35, short-circuit selecting parts SW4, SW5, and inverting type comparator amplifiers 20-2, 20-3 added and has the voltage maintaining parts, the inverting type comparator amplifiers, and the short-circuit selecting parts connected in series. The resistors R3, R4, R5, R6, R7, and R8 are resistances created by wiring, for example. Further, the resistors R1, R2 of the resistance value setting part 30 become common impedance of the inverting type comparator amplifiers 20-1, 20-2, and 20-3.

In the comparing part 310 of the chopper type comparator 300 of FIG. 8, the output (Vout1) of the inverting type comparator amplifier 20-1 is connected to the input (Vin2) of the inverting type comparator amplifier 20-2 via the voltage maintaining part 25, and the output (Vout2) of the inverting type comparator 20-2 is connected to the input (Vin3) of the inverting type comparator amplifier 20-3 via the voltage maintaining part 35.

The switch SW2 of the input selecting part 10, the short-circuit selecting part SW3, the short-circuit selecting part SW4, and the short-circuit selecting part SW5 of the comparing part 310 are controlled to be switched on by the switch control part 60 during the sampling operation. The switch SW1 of the input selecting part 10 of the comparing part 310 is controlled to be switched off by the switch control part 60 during the sampling operation. The switch SW2 of the input selecting part 10, the short-circuit selecting part SW3, the short-circuit selecting part SW4, and the short-circuit selecting part SW5 of the comparing part 310 are controlled to be switched off by the switch control part 60 during the comparing operation. The switch SW1 of the input selecting part 10 of the comparing part 310 is controlled to be switched on by the switch control part 60 during the comparing operation. The principle of the comparison is the same as that of the first embodiment.

By connecting the inverting type comparator amplifier and the voltage maintaining part in series in three steps, even in a case where the difference between the reference voltage Vref [V] input to the chopper type comparator 300 and the target comparison voltage Vin0 [V] is minute, high voltage can be output to the output (Vout3) of the inverting type comparator amplifier 20-3.

For example, supposing that Vref=2.000 [V], Vin0=2.005 [V] and that the amplification factors of the inverting type comparator amplifier 20-1, the inverting type comparator amplifier 20-2, the inverting type comparator amplifier 20-3 are all 10 times, Vout1 would equal to 0.050 [V] (=2.000−2.005)×10×−1), Vout2 would equal to −0.500 [V] (=Vout1×10×−1=0.050×10×−1) and Vout3 would equal to 5.000 [V] (=Vout2×10×−1=−0.500×10×−1). Thus, voltage of 5 [V] is output from Vout3 even in a case where the difference between Vref (2.000 [V]) and Vin0 (2.005 [V]) of the input selecting part 10 is 0.005 [V].

Accordingly, in a case of handling a fine amount of voltage, the inverting type comparator amplifiers and voltage maintaining parts are to be connected in series in multiple steps as illustrated in FIG. 8. Next, a case of handling a fine voltage is described.

Changes of current flowing in the inverting type comparator amplifiers 20-1, 20-2, and 20-3 during a sampling operation and a comparing operation are described. First, the current Iinv1 flowing in the inverting type comparator amplifier 20-1 is described. In the inverting type comparator amplifier 20-1, a fine voltage and threshold voltage Vth are compared.

For example, in the above-described example, the difference between Vref (−2.000 [V]) and Vin0 (=2.005 [V]) of the input selecting part 10 is 0.005 [V]. In this example, the voltage of the input (Vin1) of the inverting type comparator amplifier 20-1 becomes Vin1=Vth−0.005 [V]. The same as the first embodiment, the current during the sampling operation becomes maximum. However, unlike the first embodiment, the current becomes maximum also during the comparing operation as illustrated in FIG. 3. This is because the value of the voltage of Vin1 is extremely near the value of the threshold voltage (Vin1=Vth−0.005 [V]).

That is, the current Iinv1(S) during the sampling operation and the current Iinv1(C) during the comparing operation are approximately equal (Iinv(S)≈Iinv(C)). That is, ΔIinv1=Iinv1(S)−Iinv1(C)≈0. Therefore, ΔIinv1 has an extremely small effect on the change of Vth. Therefore, the resistance values of the resistors R3, R4 may be ignored.

Next, the current Iinv2 flowing in the inverting type comparator amplifier 20-2 is described.

In the above-described example, because the amplification factor of the inverting type comparator amplifier 20-1 is 10 times, the voltage of the input (Vin2) of the inverting type comparator amplifier 20-2 is Vin2=Vth+0.05 [V]. Because the voltage of the Vin2 (Vth+0.05 [V]) is extremely near the value of the Vth, the same as the Iinv1, the current Iinv2 is also large during the comparing operation.

That is, the current Iinv2(S) during the sampling operation and the current Iinv2(C) during the comparing operation are approximately equal (Iinv2(S)≈Iinv2(C)). That is, ΔIinv2=Iinv2(S)−Iinv2(C)≈0. Therefore, ΔIinv2 has an extremely small effect on the change of Vth. Therefore, the resistance values of the resistors R5, R6 may be ignored.

Next, the current Iinv3 flowing in the inverting type comparator amplifier 20-3 is described. In the above-described example, because the amplification factor of the inverting type comparator amplifier 20-2 is 10 times, the voltage of the input (Vin3) of the inverting type comparator amplifier 20-3 is Vin3=Vth−0.5 [V]. As it can be understood from the input/output characteristics of FIG. 3, the difference of the voltage Iinv(C) during the comparing operation and the voltage Iinv (S) during the sampling operation is large compared to the case of Iinv1, Iinv2 because the voltage of the Vin3 (Vth−0.5 [V]) is far from the Vth compared to Vin1, Vin2. That is, Iinv3(S) becomes greater than Iinv3(C) (Iinv3(S)>Iinv3(C)). In other words, ΔIinv3 has a large effect on the change of Vth.

Next, the influence of ΔIinv (=Iinv3(S)−Iinv3(C)) with respect to the change of Vth is described. Because a voltage drop occurs when the ΔIinv3 flows in the resistors R1, R2, R7, and R8, the voltage supplied to the positive power supply part 61 and the voltage supplied to the negative power supply part 62 are different during the sampling operation and during the comparing operation.

However, because the voltage input to the input (Vin3) of the inverting type comparator amplifier 20-3 is already amplified to a sufficiently large value (100 times) by the inverting type comparator amplifier 20-1 and the inverting type comparator amplifier 20-2, the change of Vth of the inverting type comparator amplifier 20-3 has little influence on the comparing operation. Therefore, the resistance values of the resistors R7, R8 may be ignored.

Because ΔIinv3 also flows in the resistors R1, R2 of the resistance value setting part 30 (common impedance) and causes a voltage drop, the voltage supplied to the positive power supply parts 21, 51, 61 of the inverting type comparator amplifiers 20-1, 20-2, 20-3 and the voltage supplied to the negative power supply parts 22, 52, 62 of the inverting type comparator amplifiers 20-1, 20-2, 20-3 exhibit differences during the sampling operation and the comparing operation.

In this case, because the inverting type comparator amplifier 20-1 performs the most minute voltage comparison, the change of Vth of the inverting type comparator amplifier 20-1, which is caused when a voltage drop occurs due to ΔIinv3 flowing in the resistors R1, R2 of the resistance value setting part (common impedance), has a large influence on the comparing operation.

In summarizing the above, the inverting type comparator amplifier 20-3 exhibits the largest difference between the current during the sampling operation and the current during the comparing operation. This difference of current is ΔIinv3. However, the only case in which ΔIinv3 has a large influence on the change of threshold voltage Vth during the sampling operation and the comparing operation is where voltage drop is caused when ΔIinv3 flows in the resistors R1, R2 of the resistance value setting part 30 (common impedance).

That is, although the chopper type comparator 300 illustrated in FIG. 8 is formed having three steps of inverting type comparator amplifiers, the same as the chopper type comparators 100, 200 having a single step of the inverting type comparator amplifier illustrated in FIGS. 1 and 4, only the difference of the currents flowing in the resistors R1, R2 of the resistance value setting part 30 during the sampling operation and the comparing operation has a large influence on the change of threshold voltage Vth.

Therefore, in the embodiment of FIG. 8, the resistance value(s) r1, r2 of the resistors R1 and/or R2 of the resistance value setting part 30 simply have to be set in the same manner as described in the first embodiment. That is, by setting r1 and/or r2 to a value(s) satisfying Formula (14), the change of threshold voltage due to change of power supply voltage corresponding to power consumption change can be reduced. As a result, error of comparison can be reduced, and the precision of comparison can be improved.

Third Embodiment

Figure 9:
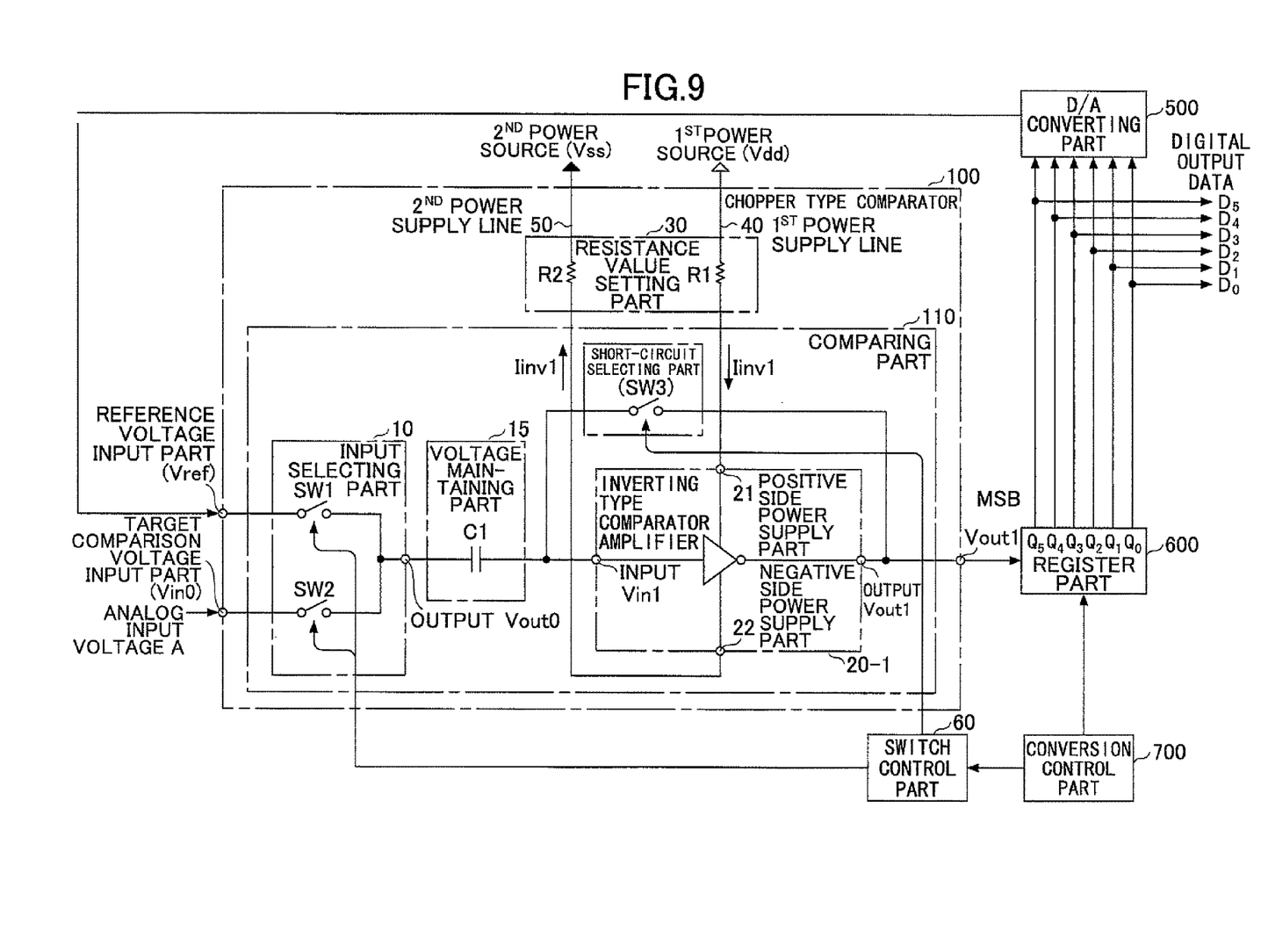
FIG. 9 is a schematic diagram illustrating an exemplary circuit configuration of an A/D converter including a chopper type comparator 100 of the present invention.

FIG. 9 is a schematic diagram illustrating an exemplary circuit configuration of an A/D converter including a chopper type comparator 100 of the present invention. In FIG. 9, like components are denoted with like reference numerals as in FIG. 1 and are not further described. FIG. 9 shows an example of a 6-bit A/D converter. The A/D converter illustrated in FIG. 9 includes the chopper type comparator 100, the switch control part 60, a D/A converting part 500, a register part 600, and a conversion control part 700.

The register part 600 sets digital data according to instructions from the conversion control part 700 and outputs the digital data to the D/A converting part 500. The D/A converting part 500 converts the digital data into analog voltage and outputs the analog voltage to the reference voltage input part (Vref) of the chopper type comparator 100. Further, the conversion control part 700 sends instructions to the switch control part 60 and controls the operations of the chopper type comparator 100.

Next, operations of the A/D converter illustrated in FIG. 9 are briefly described. An analog input voltage A is input to the target comparison input part (Vin0) of the chopper type comparator 100. The conversion control part 700 sends instructions to the switch control part 60 for performing the sampling operation in which the switch SW1 of the input selecting part 10 is switched off, the switch SW2 of the input selecting part 10 is switched on, and the short-circuit selecting part SSW3 is switched on.

Figure 10:
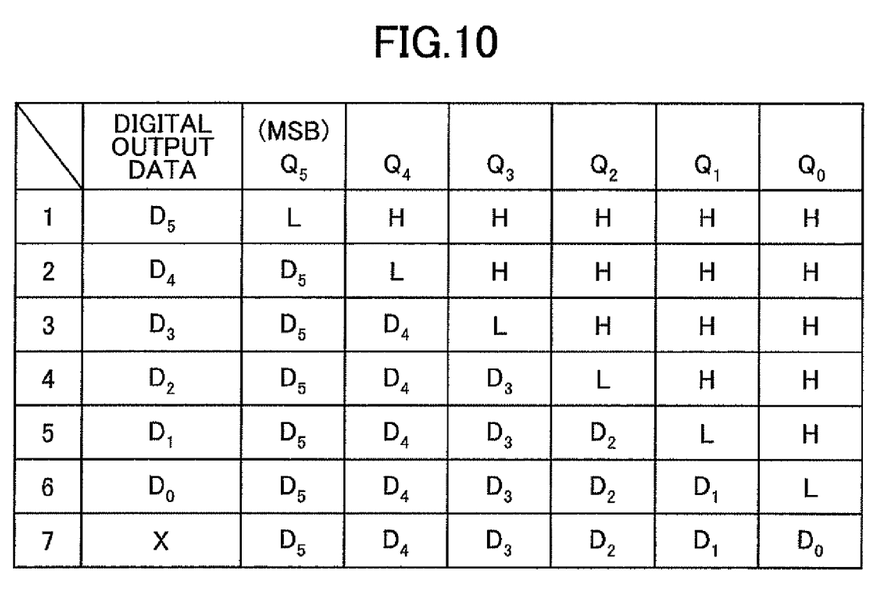
FIG. 10 is a schematic diagram illustrating an example of a truth table of a register part 600 of FIG. 9 when performing A/D conversion.

FIG. 10 is a schematic diagram illustrating an example of a truth table of the register part 600 of FIG. 9 when performing A/D conversion. The register part 600 outputs data to the D/A converting part 500 according to the truth table of FIG. 10. First, the register part 600 outputs data (LHHHHH) of data item 1 of the table of FIG. 10. The D/A converting part 500 converts the input data into corresponding analog voltages and outputs the analog voltages to the reference voltage input part (Vref) of the chopper type comparator 100.

The conversion control part 700 sends instructions to the switch control part 60 for performing a comparing operation between the analog input voltage A and the voltage of the reference voltage input part (Vref) in which the switch SW1 of the input selecting part 10 is switched on, the switch SW2 of the input selecting part 10 is switched off, and the short-circuit selecting part SW is switched off. Specific details of the sampling operation and the comparing operation have been described above in the first and second embodiments.

The comparison results are output to the register part 600 from the output Vout1 of the chopper type comparator 100. The output data become D5. Then, the register part 600 outputs data (D5LHHHH) of data item 2 of the table of FIG. 10 to the D/A converting part 500. The D/A converting part 500 converts the input data into corresponding analog voltages and outputs the analog voltages to the reference voltage input part (Vref) of the chopper type comparator 100. Then, a comparison operation between the analog input voltage A and the voltage of the reference voltage input part (Vref) is performed. The comparison results are output to the register part 600 from the output Vout1 of the chopper type comparator 100. The output data become D4.

Likewise, the register part 600 sequentially outputs the data items 3 through 7 of FIG. 10 to the D/A converting part 500 in accordance with the truth table of FIG. 10. The data input to the D/A converting part 500 are sequentially converted into corresponding analog voltages and output to the reference voltage input part (Vref) of the chopper type comparator 100, to thereby allow the analog input voltage A and the voltage of the reference voltage input part (Vref) to be sequentially compared. The data become D3 through D0. Thereby, the A/D conversion is completed and D5 through D0 become the digital data corresponding to the analog input voltage A.

Accordingly, it is possible to use the chopper type comparator 100 to form an A/D converter.

However, as described above in the first and second embodiments, when threshold voltage Vth of the chopper type comparator 100 is changed by the difference of the current during the comparing operation and the current during the sampling operation, error occurs in the comparison results between the analog input voltage and the voltage of the reference voltage input part (Vref). Thus, inaccurate conversion data are output from the A/D converter.

This is a problem particularly for a case of performing a comparing operation on low order bits (e.g., performing a comparing operation when outputting data D0). Therefore, as described in the first and second embodiments, by setting the resistance values r1, r2 of the resistors R1, R2 of the resistance setting part 30 so that Formula (14) is satisfied, a change of threshold voltage caused by change of power supply voltage corresponding to a consumption voltage change can be reduced. Thus, error of the comparison (including comparison of low order bits) by the chopper type comparator 100 can be reduced, and the precision of comparison by the A/D converter can be improved.

Further, the present invention is not limited to the embodiments explained heretofore, but variations and modifications may be made without departing from the scope of the invention.

For example, in the first through the third embodiments, although the voltage maintaining part includes a single capacitor, the voltage maintaining part may have plural capacitors connected in series or parallel or have combinations of such capacitors. As long as the voltage maintaining part can maintain voltage, the voltage maintaining part may have other configurations.

Further, in the first embodiment, an example of a chopper type comparator having a single step of an inverting type comparator amplifier is illustrated. In the second embodiment, an example of a chopper type comparator having three steps of inverting type comparator amplifiers is illustrated. Two steps of the inverting type comparator amplifiers or even a greater number of steps of inverting type comparator amplifiers may be provided in the chopper type comparator according to an embodiment of the present invention.

Further, for the sake of understanding, definite numerals are applied to the first through third embodiments. The present invention is not to be limited to the numerals applied to the first through third embodiments.

Further, in the second embodiment, a change of threshold voltage caused by the change of power voltage corresponding to a power consumption change is reduced by setting predetermined values only for the resistance values of the resistors R1, R2 having largest influence on the change of threshold voltage of the inverting type comparator amplifier. However, in a case where higher precision is required, predetermined values for reducing the change of threshold voltage may be set for resistors other than the resistors R1, R2 in the same manner described in the second embodiment.

Further, although an example of an A/D converter using the chopper type comparator 100 is described in the third embodiment, the chopper type comparator 300 may be used in an A/D converter. Further, a chopper type comparator having a greater number of steps of the inverting type comparator amplifier may also be used.

Further, although an example of a 6 bit A/D converter is described in the third embodiment, the chopper type comparator of the present invention is not to be limited to the 6 bit A/D converter.

Further, although an example of a truth table of the register part 600 is described in the third embodiment, the truth table is not to be limited to the truth table illustrated in FIG. 10.

Further, an example where a chopper type comparator is used in an A/D converter is described in the third embodiment; the chopper type comparator may be used in devices other than an A/D converter as long as the chopper type comparator is used for the purpose of comparing a voltage input to a reference voltage input part and a voltage input to a target comparison voltage input part.

The present application is based on Japanese Priority Application No. 2007-165341 filed on Jun. 22, 2007, with the Japanese Patent Office, the entire contents of which are hereby incorporated by reference.

The invention claimed is:

1. A chopper type comparator comprising:
   a first power supply line to which a first power source is supplied;
   a second power supply line to which a second power source having lower voltage than the first power source is supplied;
   a reference voltage input part to which a reference voltage is input;
   a target comparison voltage input part to which a target comparison voltage is input;
   a comparing part including an inverting type comparator amplifier having a threshold voltage of a predetermined value and being configured to compare the sizes between the reference voltage input from the reference voltage input part and the target comparison voltage input from the target comparison voltage input part;
   an output part configured to output a comparison result of the comparing part;
   a first resistance value setting part configured to set a first resistance value of the first power supply line; and
   a second resistance value setting part configured to set a second resistance value of the second power supply line;
   wherein the value of a proportion between the first resistance value of the first resistance value setting part and the second resistance value of the second resistance value setting part is set as a value that reduces a change of the threshold voltage of the inverting type comparator amplifier;

wherein the first and the second resistance value setting parts are configured to set the first and the second resistance values to satisfy an equation of $(r1/r2=(1-\alpha)/\alpha)$;

wherein r1 indicates the first resistance value, r2 indicates the second resistance value, and $\alpha$ indicates a unique value determined according to a configuration of the inverting type comparator amplifier.

2. The chopper type comparator as claimed in claim 1, wherein the proportion is set based on a change of a value of a current flowing in the inverting type comparator amplifier.

3. The chopper type comparator as claimed in claim 1, wherein the inverting type comparator amplifier includes a P-channel transistor and a N-channel transistor; wherein the proportion is set to be equal to a proportion between an ON resistance of the P-channel transistor and an ON resistance of the N-channel transistor.

4. The chopper type comparator as claimed in claim 1, wherein the first resistance value and the second resistance value include a resistance value of a resistance created by wiring.

5. The chopper type comparator as claimed in claim 1, wherein the first resistance value and the second resistance value include a resistance value of a resistance created by a bonding wire.

6. The chopper type comparator as claimed in claim 1, wherein the first resistance value and the second resistance value include a resistance value of a resistance created by a through-hole.

7. An A/D converter comprising:
a chopper type comparator including
a first power supply line to which a first power source is supplied;
a second power supply line to which a second power source having lower voltage than the first power source is supplied;
a reference voltage input part to which a reference voltage is input;
a target comparison voltage input part to which a target comparison voltage is input;
a comparing part including an inverting type comparator amplifier having a threshold voltage of a predetermined value and being configured to compare the sizes between the reference voltage input from the reference voltage input part and the target comparison voltage input from the target comparison voltage input part;
an output part configured to output a comparison result of the comparing part;
a first resistance value setting part configured to set a first resistance value of the first power supply line; and
a second resistance value setting part configured to set a second resistance value of the second power supply line;
wherein the value of a proportion between the first resistance value of the first resistance value setting part and the second resistance value of the second resistance value setting part is set as a value that reduces a change of the threshold voltage of the inverting type comparator amplifier;
wherein the first and the second resistance value setting parts are configured to set the first and the second resistance values to satisfy an equation of $(r1/r2=(1-\alpha)/\alpha)$;
wherein r1 indicates the first resistance value, r2 indicates the second resistance value, and $\alpha$ indicates a unique value determined according to a configuration of the inverting type comparator amplifier.

* * * * *